(12) United States Patent
Kim et al.

(10) Patent No.: US 7,342,281 B2
(45) Date of Patent: Mar. 11, 2008

(54) ELECTROSTATIC DISCHARGE PROTECTION CIRCUIT USING TRIPLE WELLED SILICON CONTROLLED RECTIFIER

(75) Inventors: Kwi Dong Kim, Daejeon (KR); Chong Ki Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 93 days.

(21) Appl. No.: 11/294,255

(22) Filed: Dec. 5, 2005

(65) Prior Publication Data

US 2006/0125016 A1 Jun. 15, 2006

(30) Foreign Application Priority Data

Dec. 14, 2004 (KR) ............ 10-2004-0105736
May 6, 2005 (KR) ............ 10-2005-0037956

(51) Int. Cl.
*H01L 23/62* (2006.01)

(52) U.S. Cl. ............ 257/355; 257/107; 257/132; 257/133; 257/134; 257/173; 257/213; 257/288; 257/358; 257/360; 257/361; 257/E27.033; 257/E27.063; 257/E29.225; 361/56; 361/91.5; 361/111

(58) Field of Classification Search ............ 257/107, 257/132–134, 173, 213, 288, 358, 360, 361, 257/355, E27.033, E27.063, E29.225; 361/56, 361/91.5, 111
See application file for complete search history.

(56) References Cited

U.S. PATENT DOCUMENTS

| 5,576,557 A | 11/1996 | Ker et al. |
| 6,768,616 B2 | 7/2004 | Mergens et al. |

OTHER PUBLICATIONS

"A Novel Gate-Coupled SCR ESD Protection Structure With High Latchup Immunity for High-Speed I/O Pad," Chun-Hsiang Lai et al, IEEE Electron Device Letters, vol. 25, No. 5, May 2004, pp. 328-330, © 2004 IEEE.

*Primary Examiner*—Lynne Gurley
*Assistant Examiner*—Meiya Li
(74) *Attorney, Agent, or Firm*—Ladas & Parry LLP

(57) ABSTRACT

Provided is an electrostatic discharge (ESD) protection circuit using a silicon controlled rectifier (SCR), which is applied to a semiconductor integrated circuit (IC). A semiconductor substrate has a triple well structure such that a bias is applied to a p-well corresponding to a substrate of a ggNMOS device. Thus, a trigger voltage of the SCR is reduced. In addition, two discharge paths are formed using two SCRs including PNP and NPN bipolar transistors. As a result, the ESD protection circuit can have greater discharge capacity.

5 Claims, 3 Drawing Sheets

ELECTROSTATIC DISCHARGE PROTECTION CIRCUIT USING TRIPLE WELLED SILICON CONTROLLED RECTIFIER

CROSS-REFERENCE TO RELATED APPLICATION

This application claims priority to and the benefit of Korean Patent Application No. 2004-105736, filed Dec. 14, 2004 and Korean Patent Application No. 2005-37956, filed May 6, 2005, the disclosure of which is incorporated herein by reference in its entirety.

BACKGROUND

1. Field of the Invention

The present invention relates to an electrostatic discharge (ESD) protection circuit for a low-voltage circuit, which is applied to a semiconductor integrated circuit (IC), and more specifically, to an ESD protection circuit using a silicon controlled rectifier (SCR).

2. Discussion of Related Art

An electrostatic discharge (ESD) phenomenon, which causes the instantaneous application of a high voltage due to static electricity that is induced by contact with a human body, frequently occurs during the fabrication or use of semiconductor components or electronic products. When a high voltage is applied to a semiconductor integrated circuit (IC) due to the ESD phenomenon, the semiconductor IC may be adversely affected or incapable of functions. For example, a thin insulating layer may be broken. Accordingly, the semiconductor IC should be designed in due consideration of the ESD phenomenon.

Above all, when a complementary metal-oxide-semiconductor (CMOS), which is very susceptible to a high voltage, is fabricated on the scale of deep submicrons (DSM), a gate oxide layer is further thinned out. Therefore, it is probable that damage caused by the ESD phenomenon will become greater.

In general, an ESD protection circuit, which is applied to a semiconductor IC, is configured such that a high voltage or current input through an input terminal is discharged through a discharge path before it is sent to core circuits.

FIG. 1 is a cross-sectional view of a gate grounded NMOS (ggNMOS) device, which is an example of a conventional ESD protection circuit.

Referring to FIG. 1, lightly doped drain (LDD)-type $n^+$ source 2 and drain 3 are formed in a p-type semiconductor substrate 1, and a gate 5 is formed on the semiconductor substrate 1 between the source 2 and the drain 3 and electrically insulated from the semiconductor substrate 1 by a gate insulating layer 4. A silicide layer 6 is formed on the surfaces of the gate 5, the source 2, and the drain 3 to reduce contact resistance, and the source 2 and the drain 3 are connected to input/output pads S and D. In the above-described NMOS transistor, all the terminals except the drain 3 (i.e., the gate 5 and the source 2) are connected to a ground 7, and an ESD pulse is applied through the input/output pad D connected to the drain 3.

An ESD protection circuit, which is used in the above-described ggNMOS device, is comprised of an NPN bipolar transistor Q1 that includes the source 2, the semiconductor substrate 1, and the drain 3, and a substrate resistor R1.

Such an ESD protection circuit has a good ESD protection effect owing to low trigger voltage and snapback characteristics. However, because the ESD protection circuit has insufficient current discharge capacity, its size should be enlarged to obtain a reliable ESD protection effect. The larger the ESD protection circuit is, the greater a parasitic capacitance element is. Therefore, the ESD protection circuit degrades driving capability and cannot be highly integrated.

In recent years, an ESD protection circuit using a silicon controlled rectifier (SCR) has been developed. As is known, the SCR has an excellent protection function and includes only a small parasitic capacitance element. In addition, the SCR has attracted considerable attention as a device appropriate for high-speed small-sized semiconductor ICs.

FIG. 2 is a cross-sectional view of a conventional ESD protection circuit using an SCR, and FIG. 3 is an equivalent circuit diagram of the ESD protection circuit shown in FIG. 2.

Referring to FIG. 2, a p-well 12 is formed in a $p^+$-type semiconductor substrate 11, and an n-well 13 is formed in a predetermined portion of the p-well 12. An $n^+$ region 14a and a $p^+$ region 15a are formed in an upper portion 8 of the n-well 13, and an $n^+$ region 14b and a $p^+$ region 15b are formed in an upper portion 9 of the p-well 12. The $n^+$ region 14a and the $p^+$ region 15a are used as an anode A, and the $n^+$ region 14b and the $p^+$ region 15b are used as a cathode C.

Accordingly, the $p^+$ region 15a, the n-well 13, and the p-well 12 constitute a PNP bipolar transistor Q11, and the n-well 13, the p-well 12, and the $n^+$ region 14b constitute an NPN bipolar transistor Q12. The SCR is comprised of the PNP bipolar transistor Q11 and the NPN bipolar transistor Q12. A resistor R11a is a resistance element of the n-well 13, a resistor R11b is a resistance element of the $p^+$-type semiconductor substrate 11, and a resistor R11c is a resistance element of the p-well 12.

The above-described ESD protection circuit using the SCR has even greater discharge capacity than the ggNMOS device because the PNP and NPN bipolar transistors Q11 and Q12 form a positive feedback loop. Therefore, the ESD protection circuit using the SCR can obtain an effective ESD protection effect even with a small area and is suitable for a high-frequency device by minimizing a parasitic capacitance element.

However, since a trigger (driving) voltage of the SCR is as high as about 20 to 30 V, when it is applied to a metal oxide semiconductor field effect transistor (MOSFET) that is fabricated on the DSM scale, it is difficult to effectively remove an ESD pulse before a gate oxide layer is broken. In other words, an IC that is fabricated on the DSM scale cannot endure even a voltage that is far lower than 20 V. For this reason, when the ESD pulse is applied to the IC, the gate oxide layer of the MOSFET that constitutes a core circuit may be broken.

SUMMARY OF THE INVENTION

The present invention is directed to an electrostatic discharge (ESD) protection circuit using a silicon controlled rectifier (SCR), which can be applied to an integrated circuit (IC) of a highly integrated semiconductor device that is fabricated on the scale of deep submicrons (DSM).

In addition, the present invention provides an ESD protection circuit using an SCR, which requires a low trigger voltage and has great discharge capacity.

One aspect of the present invention is to provide an ESD protection circuit using an SCR. The ESD protection circuit includes: a semiconductor substrate including a first well, a second well, a third well, and a fourth well being formed in the first well; first and second heavily doped regions formed in an upper portion of the second well; third, fourth, and fifth heavily doped regions formed in an upper portion of the third well; sixth and seventh heavily doped regions formed in an upper portion of the fourth well; an eighth heavily doped region formed at an interface between the second and third wells; a ninth heavily doped region formed at an interface between the third and fourth wells; a first gate formed on the semiconductor substrate between the third and eighth heavily doped regions and electrically insulated from the semiconductor substrate by a gate insulating layer; a second gate formed on the semiconductor substrate between the fifth and ninth heavily doped regions and electrically insulated from the semiconductor substrate by the gate insulating layer; and an RC network connected to the first and second gates and the fourth heavily doped region to apply a bias voltage to the third well.

Another aspect of the present invention is to provide an ESD protection circuit using an SCR. The ESD protection circuit includes: first and second transistors connected in parallel between first and second terminals; a first resistor connected to gates of the first and second transistors; second and third resistors connected in parallel to the first terminal; a third transistor having an emitter connected to the first resistor and having a base connected to the second and third resistors; a fourth resistor connected between a collector of the third transistor and a ground; fourth and fifth transistors connected in parallel between the second terminal and the base of the third transistor and each having a base connected to the emitter of the third transistor; and sixth and seventh transistors connected in parallel between the first terminal and the emitter of the third transistor and each having a gate connected to the base of the third transistor.

The gates of the first and second transistors may be connected to an RC network.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1:
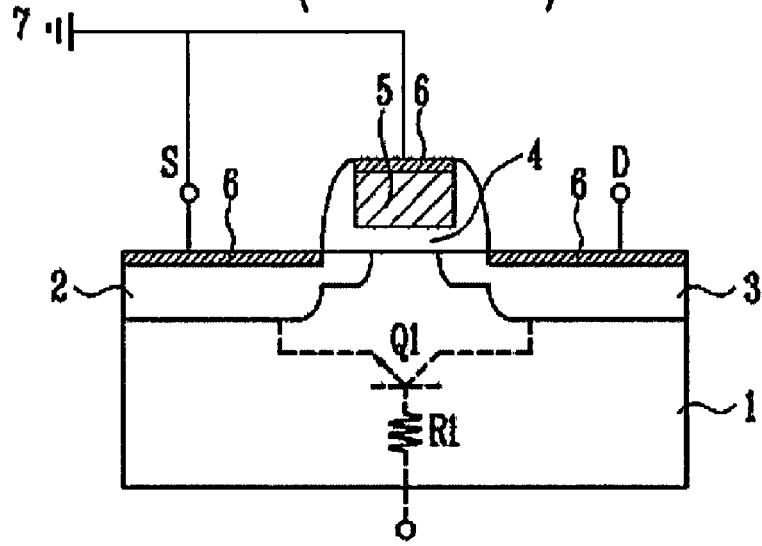
FIG. 1 is a cross-sectional view of an example of a conventional electrostatic discharge (ESD) protection circuit.
Figure 2:
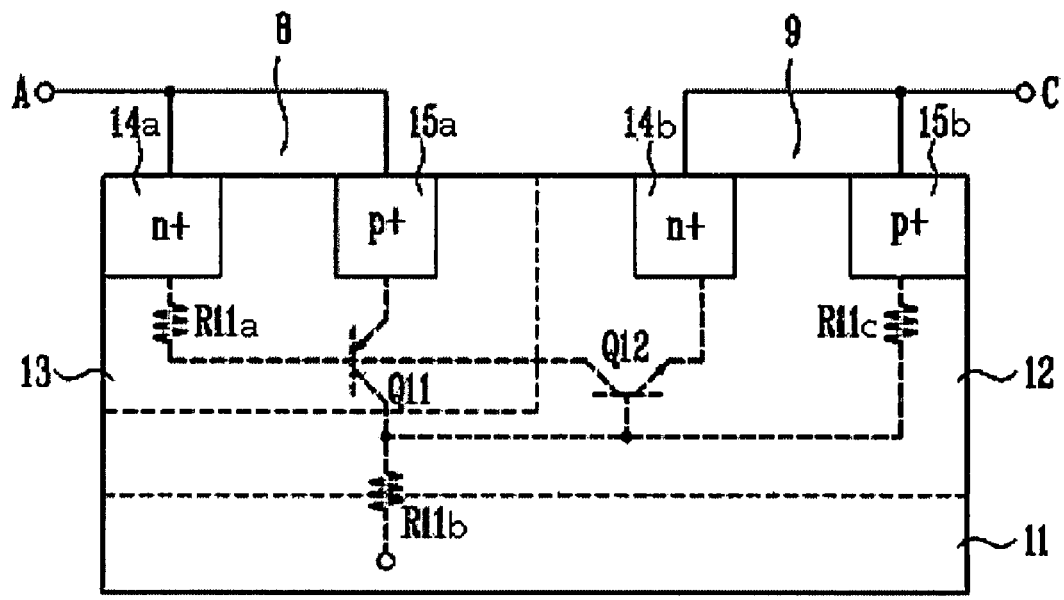
FIG. 2 is a cross-sectional view of a conventional ESD protection circuit using a silicon controlled rectifier (SCR)
Figure 3:
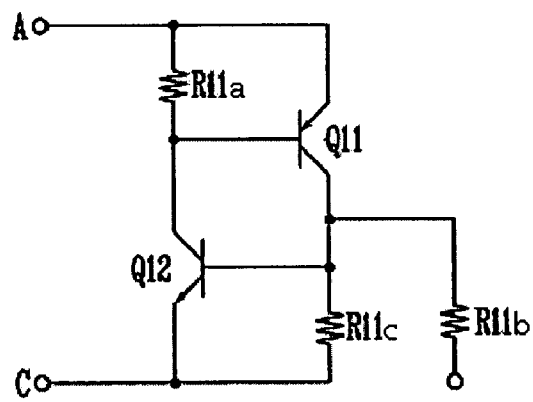
FIG. 3 is an equivalent circuit diagram of the ESD protection circuit shown in FIG. 2.
Figure 4:
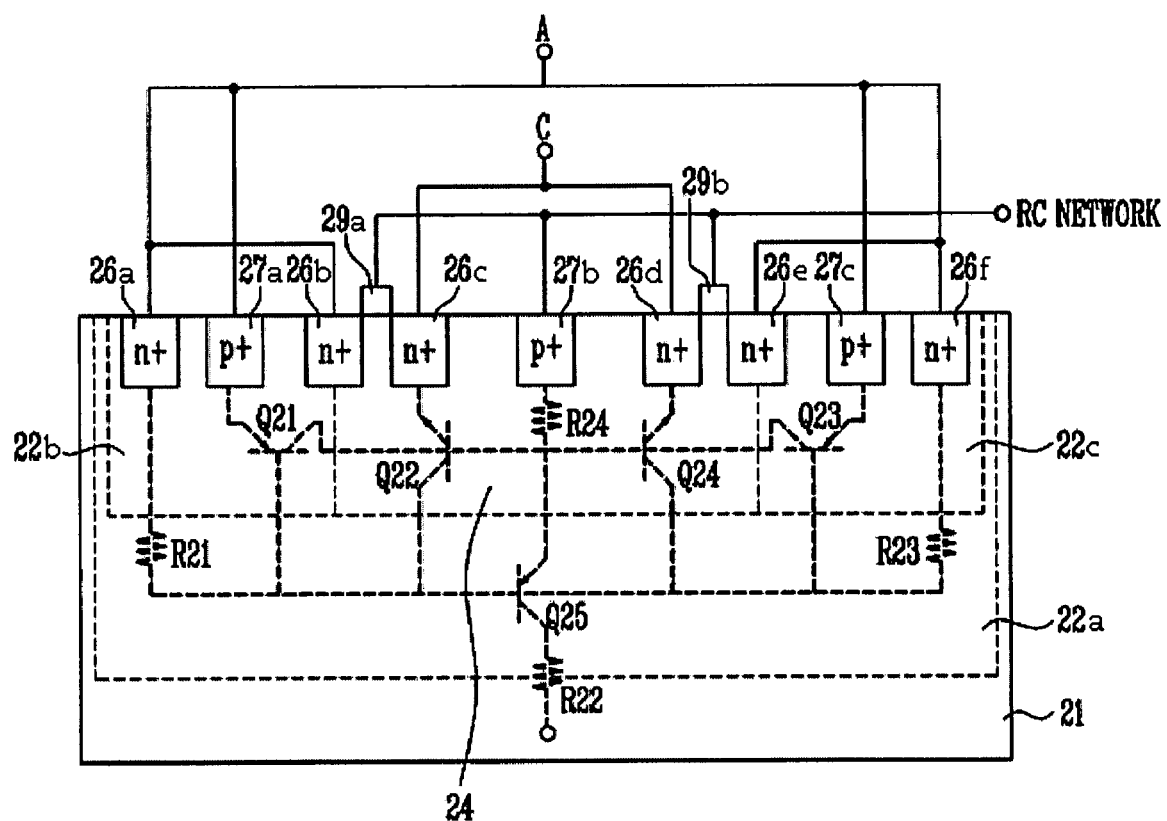
FIG. 4 is a cross-sectional view of an ESD protection circuit using an SCR according to an exemplary embodiment of the present invention.

FIG. 4 is a cross-sectional view of an electrostatic discharge (ESD) protection circuit using a silicon controlled rectifier (SCR) according to an exemplary embodiment of the present invention.

The ESD protection circuit according to the present invention is formed in a p-type semiconductor substrate 21 having a triple well structure. The p-type semiconductor substrate 21 having the triple well structure includes an n-well 22a and an n-well 22b, a p-well 24, and an n-well 22c, which are formed in the n-well 22a.

An $n^+$ region 26a and a $p^+$ region 27a are formed in an upper portion of the n-well 22b, an $n^+$ region 26c, a $p^+$ region 27b, and an $n^+$ region 26d are formed in an upper portion of the p-well 24, and a $p^+$ region 27c and an $n^+$ region 26f are formed in an upper portion of the n-well 22c. An $n^+$ region 26b is formed in an upper portion of an interface between the n-well 22b and the p-well 24, and an $n^+$ region 26e is formed in an upper portion of an interface between the p-well 24 and the n-well 22c. In addition, a gate 29a is formed on the semiconductor substrate 21 between the $n^+$ region 26b and the $n^+$ region 26c, and a gate 29b is formed on the semiconductor substrate 21 between the $n^+$ region 26d and the $n^+$ region 26e. The gate 29a is electrically insulated from the semiconductor substrate 21 by a gate insulating layer (not shown), and the gate 29b is electrically insulated from the semiconductor substrate 21 by the gate insulating layer.

The $n^+$ region 26a, the $p^+$ region 27a, the $n^+$ region 26b, the $n^+$ region 26e, the $p^+$ region 27c, and the $n^+$ region 26f are used as an anode A, the $n^+$ region 26c and the $n^+$ region 26d are used as a cathode C, and the gate 29a, the $p^+$ region 27b, and the gate 29b are connected to an RC network.

Accordingly, the $p^+$ region 27a, the n-well 22b, and the p-well 24 constitute a PNP bipolar transistor Q21, the $n^+$ region 26c, the p-well 24, and the n-well 22a constitute an NPN bipolar transistor Q22, the $n^+$ region 26d, the p-well 24, and the n-well 22a constitute an NPN bipolar transistor Q24, the $p^+$ region 27c, the n-well 22c, and the p-well 24 constitute a PNP bipolar transistor Q23, and the p-well 24, the n-well 22a, and the p-type semiconductor substrate 21 constitute a PNP bipolar transistor Q25. A resistor R21 and a resistor R23 are resistance elements of the n-well 22a, a resistor R22 is a resistance element of the p-type semiconductor substrate 21, and a resistor R24 is a resistance element of the p-well 24.

Figure 5:
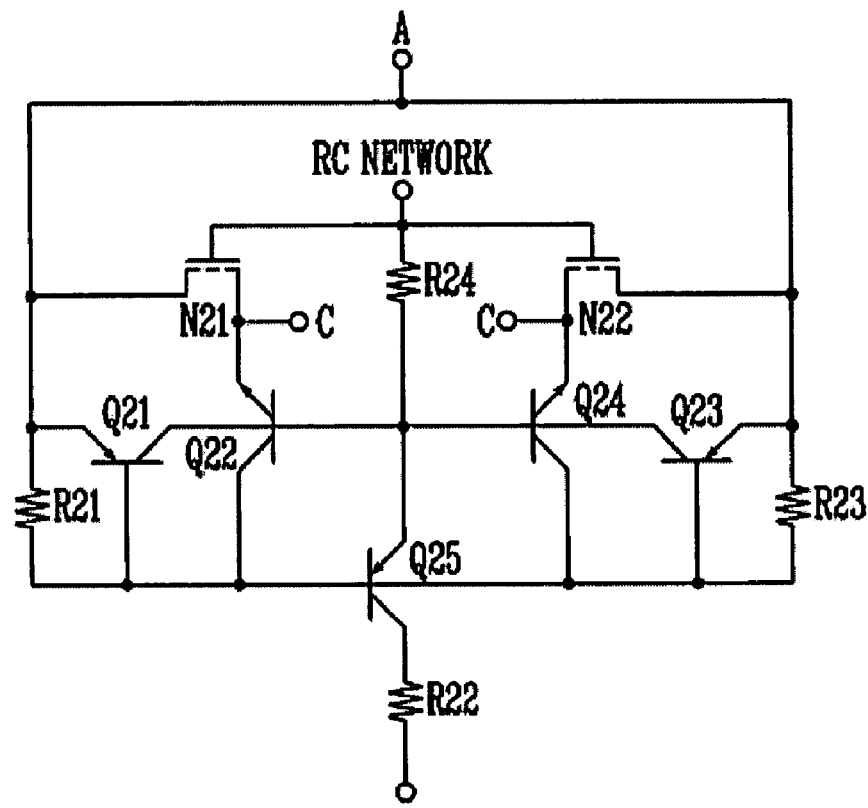
FIG. 5 is an equivalent circuit diagram of the ESD protection circuit shown in FIG. 4.

FIG. 5 is an equivalent circuit diagram of the ESD protection circuit shown in FIG. 4.

An NMOS transistor N21 and an NMOS transistor N22 are connected in parallel between the anode A and the cathode C. The resistor R24 is connected to gates of the NMOS transistors N21 and N22, and the resistors R21 and R23 are connected in parallel to the anode A. The PNP bipolar transistor Q25, which has a base connected to the resistors R21 and R23, and the resistor R22 are connected in series between the resistor R24 and a ground. The NPN bipolar transistors Q22 and Q24 are connected in parallel between the cathode C and the base of the PNP bipolar transistor Q25. The PNP transistors Q21 and Q23, each of which has a base connected to the base of the PNP bipolar transistor Q25, are connected in parallel between the anode A and an emitter of the PNP bipolar transistor Q25.

The anode A is connected to an input and output pads, the cathode C is connected to the ground, and the RC network is connected to the gates of the NMOS transistors N21 and N22.

Since an SCR changes from a high impedance to a low impedance, it is typically employed in power devices. However, the SCR can be appropriately designed to produce a good ESD protection effect.

Figure 6:
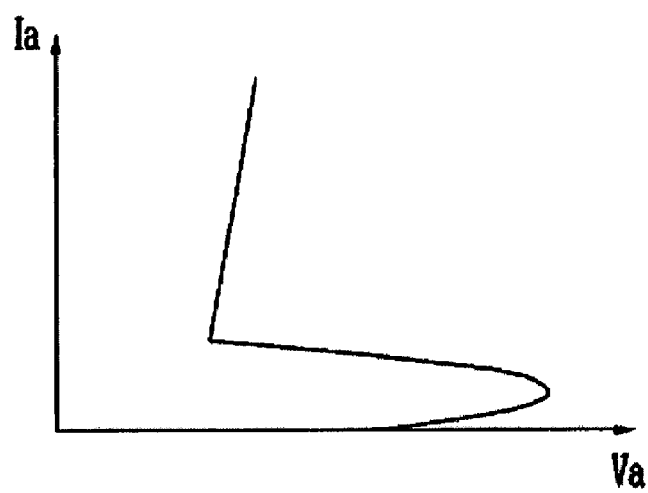
FIG. 6 is a graph of current Ia with respect to anode voltage Va.

When a predetermined voltage Vc, for example, a power supply voltage, is applied to the n-well 22a, a voltage Va that is higher than or equal to the voltage Vc is applied to the anode A, and the cathode C and the p-type semiconductor substrate 21 are connected to the ground, an anode current Ia varies with the voltage Va applied to the anode A as shown in FIG. 6.

Hereinafter, the operation of the above-described ESD protection circuit using the SCR according to the present invention will be described.

When an ESD pulse is input through an input pad and a voltage Va at the anode A is higher than the voltage Vc, the $p^+$ region 27a and the n-well 22b are forwardly biased. In this case, an emitter and the base of the PNP bipolar transistor Q21 are forwardly biased due to a voltage drop caused by the resistor R21 of the n-well 22a, so that the PNP bipolar transistors Q21 and Q25 are turned on. Thus, a current is supplied to the p-type semiconductor substrate 21. Simultaneously, the $p^+$ region 27c and the n-well 22c also are forwardly biased, and the PNP bipolar transistors Q23 and Q25 are turned on due to a voltage drop caused by the resistor R23 of the n-well 22a. Thus, a current is supplied to the p-type semiconductor substrate 21. As a result, holes are supplied from the anode A and transported to the cathode C connected to the ground through the p-type semiconductor substrate 21, which acts as a collector of the PNP bipolar transistor Q25.

In addition, when the NPN bipolar transistors Q22 and Q24 are turned on due to a voltage drop caused by the resistor R22 of the p-type semiconductor substrate 21, electrons are supplied from the cathode C connected to the ground and transported to the anode A through the NPN bipolar transistors Q22 and Q24.

As the electrons are transported as described above, the voltage drops caused by the resistors R21 and R23 are further increased so that a positive loop is formed to induce sufficient discharge. Specifically, since the NPN bipolar transistor Q22 and Q24 are forwardly biased due to a current that is supplied to the cathode C through the PNP bipolar transistors Q21 and Q25 and the PNP bipolar transistors Q23 and Q25, it is not necessary to hold the forward biasing of the PNP bipolar transistors Q21 and Q25 and the PNP bipolar transistors Q23 and Q25 any more. As a result, the voltage Va at the anode A is minimized. In this case, the minimized voltage Va at the anode A is referred to as a holding voltage, which depends on a current that passes through the PNP bipolar transistors Q21 and Q23.

Two SCRs are comprised of the PNP bipolar transistors Q21 and Q25 and the NPN bipolar transistor Q22 or the PNP bipolar transistors Q23 and Q25 and the NPN bipolar transistor Q24. Each of the SCRs can be maintained in a latch mode by satisfying the following Equation 1:

$$\beta_{npn} \cdot \beta_{pnp} \geq 1 \tag{1},$$

wherein $\beta_{npn}$ and $\beta_{pnp}$ denote current gains of an NPN bipolar transistor and a PNP bipolar transistor, respectively.

In an SCR, $I_{trig}$ and $V_h$ may be given as two important variables. $I_{trig}$ is a current that passes through a p-well and an n-well and depends on a resistance element of a p-type semiconductor substrate. The resistance element is determined by a thickness L and concentration of the p-type semiconductor substrate. In addition, $V_h$ denotes a voltage difference between the anode A and the cathode C and is greatly affected by the thickness L and a resistance element of the n-well. In general, a complementary metal-oxide-semiconductor (CMOS) device that is fabricated on the scale of deep submicrons (DSM) has a voltage difference $V_h$ of 2 to 5 V.

In order to trigger the SCR, the n-well and a $p^+$ region need to have an avalanche breakdown, and a trigger voltage is defined as a breakdown voltage of the n-well and the p-type semiconductor substrate.

The present invention makes use of the semiconductor substrate 21 having the triple well structure to reduce the trigger voltage of the ESD protection circuit. For a gate grounded NMOS (ggNMOS) device, it is known that forward biasing increases an electric potential of a substrate, thus reducing a voltage Vt1 at which a snapback happens. However, for a typical substrate structure, it is difficult to apply such a bias to the substrate. Accordingly, the semiconductor substrate having the triple well structure according to the present invention is configured such that a bias is directly applied to a p-well corresponding to the substrate of the ggNMOS device. As a result, the SCR of the present invention can reduce a trigger voltage lower than a conventional SCR.

In order to apply a bias to the p-well 24, the present invention adopts the RC network. A voltage is applied from the RC network to the gates of the NMOS transistors N21 and N22 and the $p^+$ region 27b of the p-well 24, with the result that a critical voltage of the NMOS transistors N21 and N22 is reduced to decrease a trigger voltage. In this case, the trigger voltage depends on a resistance R and capacitance C of the RC network. Since the RC network is typically known, a detailed description thereof will not be presented here.

In the present invention, two SCRs are comprised of the PNP bipolar transistors Q21 and Q25 and the NPN bipolar transistor Q22 or the PNP bipolar transistors Q23 and Q25 and the NPN bipolar transistor Q24. Thus, two discharge paths are formed at once so that the ESD protection circuit gets excellent discharge capacity.

Nowadays, with the introduction of DSM-scale fabrication to semiconductor devices, there is a tendency to decrease the driving voltage of the semiconductor devices and the thickness of an insulating layer. Accordingly, it is expected that damage caused by an ESD phenomenon will become greater. To solve this problem, it is necessary to develop an ESD protection circuit that operates at a low voltage and requires a low trigger voltage.

A conventional ESD protection circuit using an SCR has a good ESD protection effect but cannot be applied to a highly integrated device owing to a high trigger voltage.

The present invention makes use of a semiconductor substrate having a triple well structure such that a bias can be directly applied to a p-well corresponding to a substrate of a ggNMOS device. As a result, the SCR of the present invention can reduce a trigger voltage lower than a conventional SCR. Furthermore, since two discharge paths can be formed using two SCRs, the ESD protection circuit gets excellent discharge capacity.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An electrostatic discharge protection circuit using a silicon controlled rectifier, the circuit comprising:
   a semiconductor substrate including a first well, a second well, a third well, and a fourth well wherein the second well, the third well, and the fourth well are formed in the first well;
   first and second heavily doped regions formed in an upper portion of the second well;
   third, fourth, and fifth heavily doped regions formed in an upper portion of the third well;
   sixth and seventh heavily doped regions formed in an upper portion of the fourth well;
   an eighth heavily doped region formed at an interface between the second and third wells;
   a ninth heavily doped region formed at an interface between the third and fourth wells;
   a first gate formed on the semiconductor substrate between the third and eighth heavily doped regions and electrically insulated from the semiconductor substrate by a gate insulating layer; and
   a second gate formed on the semiconductor substrate between the fifth and ninth heavily doped regions and electrically insulated from the semiconductor substrate by the gate insulating layer.

2. The circuit according to claim 1, further comprising an RC network connected to the first and second gates and the fourth heavily doped region to apply a bias voltage to the third well.

3. The circuit according to claim 1, wherein the first, second, and fourth wells and the first, third, fifth, seventh, eighth, and ninth heavily doped regions are doped with impurity ions of a first conductivity type, and the third well and the second, fourth, and sixth heavily doped regions are doped with impurity ions of a second conductivity type.

4. The circuit according to claim 3, wherein the first conductivity type is an n-type, and the second conductivity type is a p-type.

5. The circuit according to claim 1, wherein the first, second, sixth, seventh, eighth, and ninth heavily doped regions are connected to input and output pads, and the third and fifth heavily doped regions are connected to a ground.

* * * * *